United States Patent
Ruby et al.

(10) Patent No.: US 6,710,508 B2
(45) Date of Patent: Mar. 23, 2004

(54) METHOD FOR ADJUSTING AND STABILIZING THE FREQUENCY OF AN ACOUSTIC RESONATOR

(75) Inventors: Richard C. Ruby, Menlo Park, CA (US); Joe Qingzhe Wen, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/996,951

(22) Filed: Nov. 27, 2001

(65) Prior Publication Data

US 2003/0098631 A1 May 29, 2003

(51) Int. Cl.[7] .............................. H01L 41/08
(52) U.S. Cl. ...................... 310/312; 310/364
(58) Field of Search ................. 310/312, 320, 310/322, 324, 334

(56) References Cited

U.S. PATENT DOCUMENTS

| | | | | |
|---|---|---|---|---|
| 4,130,771 A | * | 12/1978 | Bottom | 310/312 |
| 5,185,589 A | * | 2/1993 | Krishnaswamy et al. | 310/320 X |
| 6,051,907 A | * | 4/2000 | Ylilammi | 310/312 |
| 6,060,818 A | | 5/2000 | Ruby et al. | |
| 6,081,171 A | * | 6/2000 | Ella | 333/189 |
| 6,249,074 B1 | * | 6/2001 | Zimnicki | 310/312 |
| 6,420,820 B1 | * | 7/2002 | Larson, III | 310/346 |
| 6,424,237 B1 | * | 7/2002 | Ruby et al. | 333/187 |
| 6,469,597 B2 | * | 10/2002 | Ruby et al. | 333/187 |
| 6,472,954 B1 | * | 10/2002 | Ruby et al. | 333/133 |
| 6,483,229 B2 | * | 11/2002 | Larson, III et al. | 310/348 |

* cited by examiner

*Primary Examiner*—Mark Budd (57) ABSTRACT

In an array of acoustic resonators, the resonant frequencies of the resonators are adjusted and stabilized in order to achieve target frequency responses for the array. The method of adjusting is achieved by intentionally inducing oxidation at an elevated temperature. Thermal oxidation grows a molybdenum oxide layer on the surface of the top electrode of an electrode-piezoelectric stack, thereby increasing the relative thickness of the electrode layer to the piezoelectric layer. In one embodiment, the resonant frequency of an FBAR is adjusted downwardly as the top electrode layer increases relative to the piezoelectric layer. In another embodiment, the method of stabilizing is achieved by intentionally inducing oxidation at an elevated temperature.

5 Claims, 10 Drawing Sheets

METHOD FOR ADJUSTING AND STABILIZING THE FREQUENCY OF AN ACOUSTIC RESONATOR

TECHNICAL FIELD

The invention relates generally to acoustic resonators and more particularly to adjusting and stabilizing the resonant frequency of a film bulk acoustic resonator (FBAR).

BACKGROUND ART

In many different communications applications, a common signal path is coupled to both an input of a receiver and an output of a transmitter. For example, in a cellular or cordless telephone, an antenna may be coupled to the receiver and the transmitter. In such an arrangement, a duplexer is often used to couple the common signal path to the input and the output. The function of the duplexer is to provide the necessary coupling to and from the common signal path, while preventing the signals generated by the transmitter from being coupled to the input of the receiver.

One type of duplexer is referred to as the half duplexer. A half duplexer uses a switch to connect the common signal path to the receiver or the transmitter on a time division basis. The half duplexer has the desired attenuation properties, but is unacceptable in many telephony applications, since it does not allow parties of a call to speak and be heard simultaneously.

Figure 1:
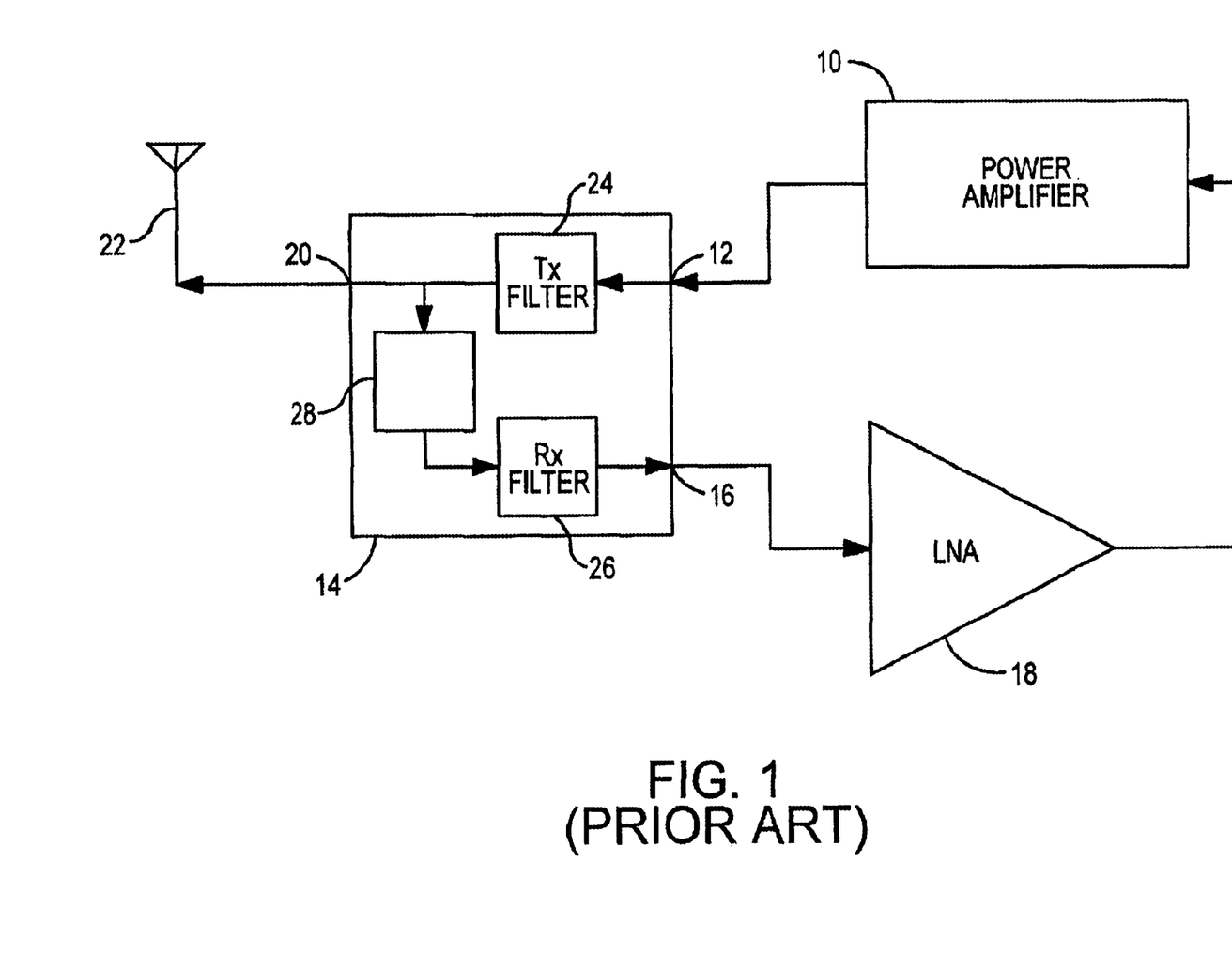
FIG. 1 is a block diagram of a front-end circuit of a conventional cellular telephone or similar device.

A type of duplexer that is more acceptable for telephony applications is the full duplexer. A full duplexer operates only if the transmit signal has a frequency that is different than the frequency of the receive signal. The full duplexer incorporates band-pass filters that isolate the transmit signal from the receive signal according to the frequencies. FIG. 1 illustrates a conventional circuit used in cellular telephones, personal communication system (PCS) devices and other transmit/receive devices. A power amplifier 10 of a transmitter is connected to a transmit port 12 of a full duplexer 14. The duplexer also includes a receive port 16 that is connected to a low noise amplifier (LNA) 18 of a receiver. In addition to the transmit port and the receive port, the duplexer 14 includes an antenna port 20, which is connected to an antenna 22.

The duplexer 14 is a three-port device having the transmit port 12, the receive port 16 and the antenna port 20. Internally, the duplexer includes a transmit band-pass filter 24, a receive band-pass filter 26 and a phase shifter 28. The passbands of the two filters 24 and 26 are respectively centered on the frequency range of the transmit signal that is input via the power amplifier 10 and the receive signal to which the receiver is tuned.

The requirements for the band-pass filters 24 and 26 of the duplexer 14 are stringent. The band-pass filters must isolate low intensity receive signals generated by the antenna 22 from the strong transmit signals generated by the power amplifier 10. In a typical embodiment, the sensitivity of the low noise amplifier may be in the order of –100 dBm, while the power amplifier may provide transmit signals having an intensity of approximately 28 dBm. Thus, the duplexer 14 must attenuate the transmit signal by approximately 50 dB between the antenna port 20 and the receive port 16 to prevent any residual transmit signal mixed with the receive signal at the receive port from overloading the low noise amplifier.

One type of PCS that is used in a mobile telephone employs code division multiple access (CDMA). The CDMA PCS wireless bands are approximately 1900 MHz and have an especially stringent regulatory requirement for duplexer performance. Some concerns will be identified with reference to FIG. 2. A passband 30 is defined by at least two of poles and at least two of zeros. The poles and zeros are equidistantly spaced from a center frequency 32. For the transmitter passband 30, the transmitter-to-antenna insertion loss 34 is preferably less than –3 dB over most of the band. The isolation from the transmitter to receiver ports exceeds 50 dB across most of the transmitter band and 46 dB in the receiver band. The crossover between the transmitter and receiver bands occurs around 1900 MHz, which is 20 MHz below the CDMA specification. As will be explained more fully below, the lower-frequency pole is determined by the characteristics of shunt resonators, while the higher-frequency pole is determined by the characteristics of series resonators.

Another challenge for the duplexer is achieving power handling requirements. The power amplifier 10 in the transmitter of FIG. 1 can deliver 1 Watt of power to the transmit port 12 of the duplexer 14. The band-pass filter 24 must be capable of handling such power without being destroyed and without its performance being degraded.

Figure 3:
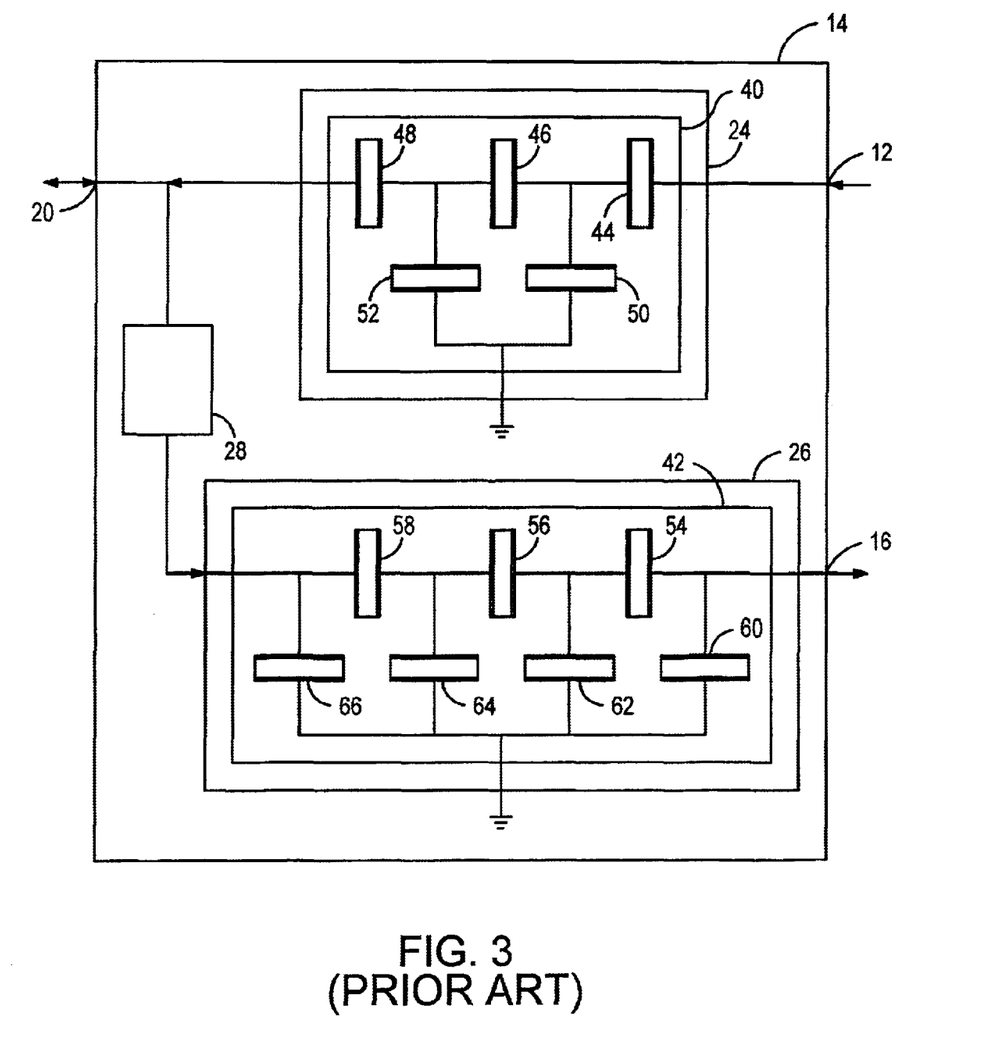
FIG. 3 is a schematic block diagram of a conventional full duplexer.

The duplexer 14 of FIG. 1 will be described in greater detail with reference to FIG. 3. The duplexer includes a transmit film bulk acoustic resonator (FBAR) array 40 and a receive FBAR array 42. The transmit FBAR array 40 is a 2½-stage ladder circuit having three series FBARs 44, 46 and 48 and two shunt FBARs 50 and 52. The series FBARs are connected in series between the transmit port 12 and the antenna port 20, while the shunt FBARs are connected between electrical ground and nodes between the series FBARs. Each full stage of an FBAR array is composed of one series FBAR and one shunt FBAR. A half stage is limited to either one series FBAR or one shunt FBAR. In the exemplary array 40, the half stage is the series FBAR 48.

The receive FBAR array 42 is a 3½-stage ladder circuit. The FBAR array includes three series FBARs 54, 56 and 58 and four shunt FBARs 60, 62, 64 and 66. The series FBARs are connected in series between the ninety degree phase shifter 28 and the receive port 16. The shunt FBARs are connected between electrical ground and nodes between the series FBARs.

Circuits suitable for use as the ninety degree phase shifter 28 are known in the art. As examples, the phase shifter may be composed of inductors and capacitors or may be a $\lambda/4$ transmission line.

Figure 2:
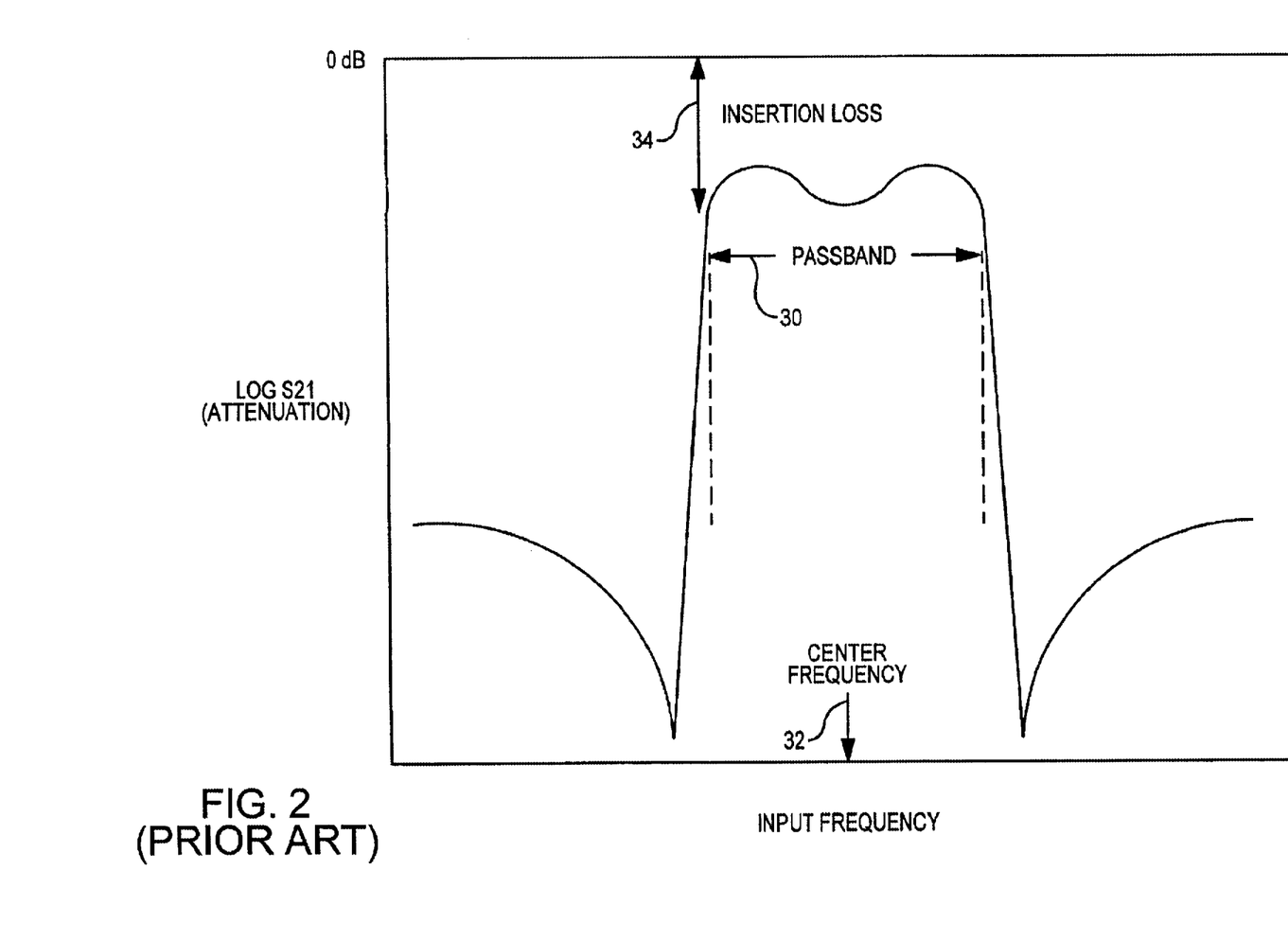
FIG. 2 is a graph showing the characteristics of a band-pass filter of the type used in FIG. 1.

Within the transmit FBAR array 40, each series FBAR 44, 46 and 48 may have the same resonant frequency ($f_r$). Similarly, the shunt FBARs 50 and 52 may have the same resonant frequency, but the resonant frequency of the series FBARs is approximately 3.0 percent greater than that of the shunt FBARs. As a result, the two poles that were described with reference to FIG. 2 are provided.

The receive FBAR array 42 of the receive band-pass filter 26 may also be composed of series FBARs 54, 56 and 58 having the same $f_r$ and shunt FBARs 60, 62, 64 and 66 having the same $f_r$ that is 3.0 percent different than the resonant frequency of the series FBARs. However, in the duplexer 14 of a CDMA PCS device, the receive band-pass filter 26 is required to attenuate the transmit signal to such a low level that the residual transmit signal mixed with the receive signal at the receive port 16 does not overload the low noise amplifier 18 of FIG. 1. Consequently, the transmit signal rejection requirements of the receive band-pass filter are considerably more stringent than the receive signal rejection requirements of the transmit band-pass filter 24. This is most easily achieved if the shunt FBARs 60, 62, 64 and 66 of the receive FBAR array have more than one resonant frequency.

In comparing the transmit FBAR array 40 to the receive FBAR array 42, the resonant frequency of the series FBARs 54, 56 and 58 of the receive FBAR array may be approximately 80 MHz higher than the resonant frequency of the series FBARs 44, 46 and 48 of the transmit FBAR array. As a result, the center frequencies of the two arrays will be offset.

In view of the duplexer 14, it is important that each FBAR in the transmit FBAR array 40 and the receive FBAR array 42 be tuned to its target frequency, so that the transmit band-pass filter 24 and the receive band-pass filter 26 can properly isolate the transmit signals from the receive signals without any objectionable crossover noise. Furthermore, optimal performance of the duplexer 14 can only be achieved if the band-pass filters 24 and 26 remain stable over an extended period of time without any frequency shift in either direction, i.e., an increase or a decrease in frequency.

While high-quality manufacturing environments have produced FBARs exhibiting resonant frequencies within an acceptable margin of error (e.g., within 1%) of the target resonant frequency on the same wafer, FBARs fabricated on different wafers may not produce the target resonant frequency required for optimal performance. As a result, a number of FBARs may yield resonant frequencies that are beyond the acceptable margin of error of the target resonant frequency.

Figure 4:
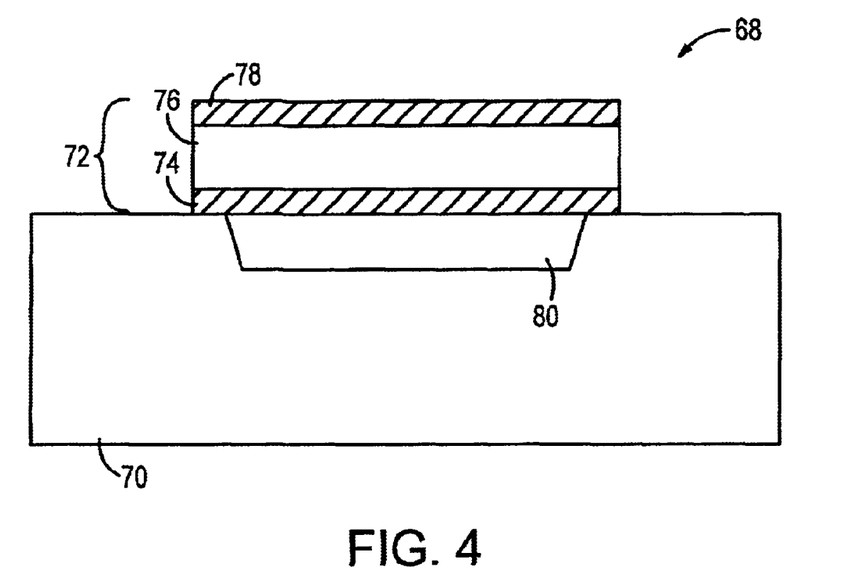
FIG. 4 is a cross-sectional view of an FBAR.

One known technique which attempts to adjust the resonant frequencies of FBARs involves reducing the thickness of an FBAR by etching away portions of the top electrode layer using, for example, fluorine plasma or chlorine plasma. Referring to FIG. 4, an FBAR 68 is shown as comprising of an electrode-piezoelectric stack 72 that is above a substrate 70. The electrode-piezoelectric stack 72 has a bottom metallic electrode layer 74 and a top metallic electrode layer 78 with a piezoelectric (PZ) layer 76 sandwiched between the two electrode layers 74 and 78. By removing portions of the top electrode layer 78, the resonant frequency exhibited by the FBAR 68 can be adjusted upwardly. Unfortunately, this method requires sputtering a protective layer (e.g., aluminum) that is chemically inert to the etching process over the portions of the FBAR which are not to be etched. This extra step adds to the overall cost of FBAR fabrication.

Consequently, it is the object of this invention to provide a fabrication method and a resulting FBAR with a resonant frequency that is within an acceptable margin of error of a target resonant frequency. Moreover, it is the object of this invention to provide a fabrication method for stabilizing the resonant frequency of an FBAR to avoid objectionable shifts in frequency.

SUMMARY OF THE INVENTION

In accordance with one embodiment of the invention, when FBARs fabricated on one wafer exhibit off-target resonant frequencies due to, for example, slight variations in the thicknesses of the wafers, the required FBAR performance is still achieved by adjusting their resonant frequencies to conform to the target resonant frequencies. The preferred method for adjusting the resonant frequency of an off-target FBAR requires intentionally oxidizing a top surface of the top metallic electrode layer at an elevated temperature for a selected period of time. The oxidization process induces a change in the molecular structure of the electrode material (e.g., Mo) from one state to another when the electrode is exposed to the oxygen. Specifically, the Mo reacts with oxygen to form molybdenum oxide.

In one embodiment, the Mo is intentionally exposed to an oxidizing environment that is gas comprising of about 20% oxygen. The oxidation process can be accelerated by elevating the temperature of the oxidation-inducing environment over a hot-plate or similar structure.

In another embodiment, the oxidizing environment is within a rapid thermal annealer (RTA) in which the temperature and the amount of oxygen entering into the oxidizing environment can easily be controlled. By elevating the temperature within the RTA, the rate of oxidation increases due to the accelerated movement of the molecules. Moreover, increasing the percentage of oxygen within the RTA accelerates the oxidation process.

By intentionally inducing oxidation of an FBAR, the Mo on the top surface of the electrode layer reacts with oxygen to form molybdenum oxide molecules. As the oxidation process continues over a controlled time interval at an elevated temperature, the molybdenum oxide molecules continue to grow on the top surface of the electrode layer, thereby increasing the thickness of the top metallic electrode layer.

For a given FBAR, since the resonant frequency is dependent upon the "weighted thickness" (i.e., the physical thickness weighted on the basis of the selection of electrode and piezoelectric materials) of the electro-piezoelectric stack, the resonant frequency can be modified by varying the total thickness of the electrode layers relative to the piezoelectric layer. Hence, the resonant frequency exhibited by the FBAR can be adjusted downwardly by increasing the ratio of the total thickness of the electrode layers relative to the piezoelectric layer. Conversely, the resonant frequency exhibited for the same FBAR can be adjusted upwardly by decreasing the ratio of the total thickness of the electrode layers relative to the piezoelectric layer. In accordance with the invention, as the number of molybdenum oxide molecules continues to grow on the surface of the top electrode layer, thereby increasing the thickness of one of the two electrode layers relative to the piezoelectric layer, the resonant frequency of the FBAR is adjusted downwardly.

According to another aspect of the invention, intentionally inducing oxidation is used as a technique for stabilizing the resonant frequency for a given FBAR. As the molybdenum oxide layer continues to grow on the surface of the top electrode, the number of Mo available for oxidation decreases in a logarithmic manner. For example, although it might take two hours to grow 100 angstroms of molybdenum oxide, it may take another 10 hours to grow a duplicate amount. The reason for this phenomenon is that a decline occurs in the availability of Mo for oxidation as Mo transforms into molybdenum oxides. Hence, the thickness of the top electrode layer approaches a finite level over an extended period as the rate of oxidation decreases. Since the resonant frequency is dependent upon the "weighted thickness" of the piezoelectric stack, the resonant frequency for an FBAR is stabilized as the thickness of the electrode approaches a steady state relative to the piezoelectric layer.

DETAILED DESCRIPTION OF THE INVENTION

Figure 5:
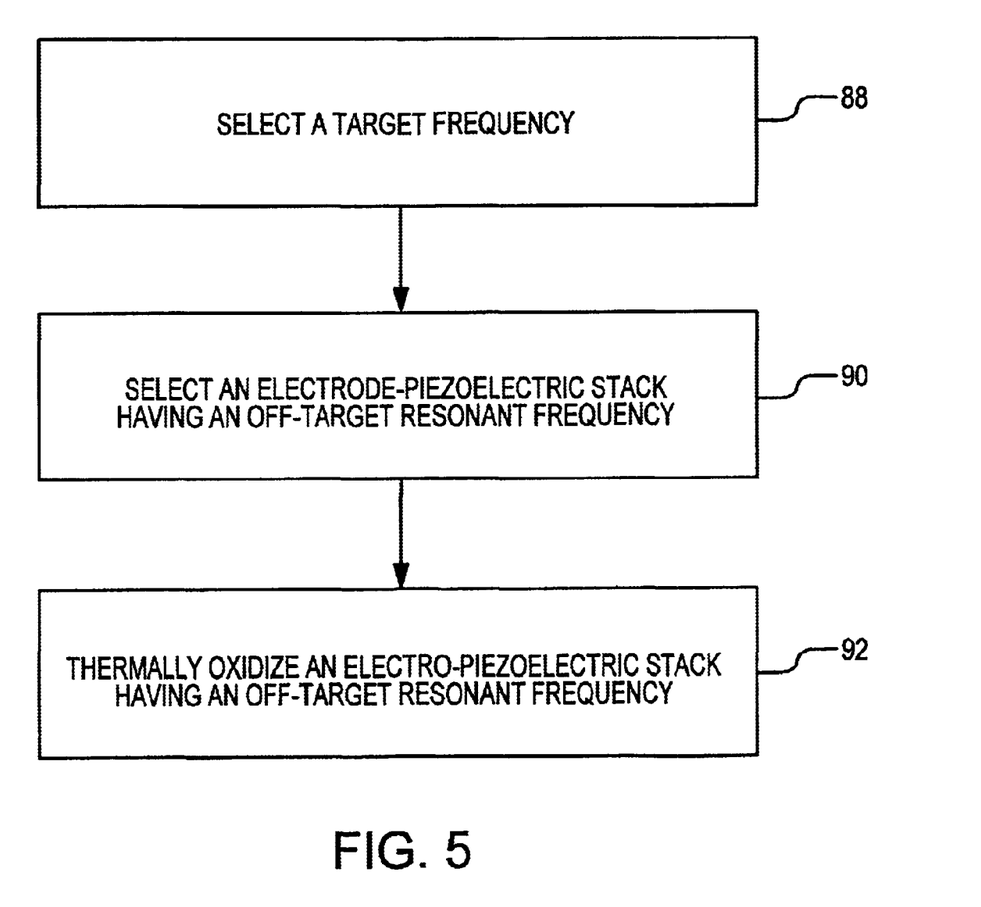
FIG. 5 is a process flow diagram for adjusting and stabilizing the resonant frequency of an FBAR in accordance with the present invention.

With reference to FIG. 5, the process flow of steps for adjusting the resonant frequency of an FBAR are sequentially shown. In the formation of a communication component, such as the duplexer 14 of FIG. 1, that is compatible with CDMA requirements, the target frequency is likely to be in the range of 1800 MHz to 2000 MHz. In accordance with the invention, a target resonant frequency is selected for an FBAR in step 88. The target resonant frequency may comply with CDMA requirements, but the invention may be used in other applications.

Referring to FIG. 4, the FBAR 68 may be formed on top of a substrate 70, but this is not critical. Conventionally, FBARs of the type described are formed on a silicon substrate. As shown, the FBAR 68 comprises an electrode-piezoelectric stack 72 that is above the substrate 70. The electrode-piezoelectric stack 72 has a bottom metallic electrode layer 74 and a top metallic electrode layer 78 with a piezoelectric (PZ) layer 76 sandwiched between the two electrode layers. The preferred material for forming the piezoelectric layer 76 is AlN, but other materials may be utilized (e.g., zinc oxide). The preferred electrode material for electrode layers 74 and 78 is Mo, but other metals may be substituted (e.g., aluminum, tungsten, gold or titanium). For a given FBAR, the resonance characteristics are dependent upon geometrical factors such as the thickness of the piezoelectric layer 76, the thicknesses of the electrodes 74 and 78, and the area of overlap between the electrodes. For example, the resonant frequency is dependent upon the "weighted thickness" of the electrode-piezoelectric stack. The weighted thickness is the physical thickness with an adjustment that is based upon the selection of the electrode and piezoelectric materials. The adjustment is necessary, since the velocity of sound is different in different materials. Changing the weighted thickness of one or both of the electrodes changes the weighted thickness of the electrode-piezoelectric stack, thereby adjusting the resonant frequency of the stack.

Figure 6:
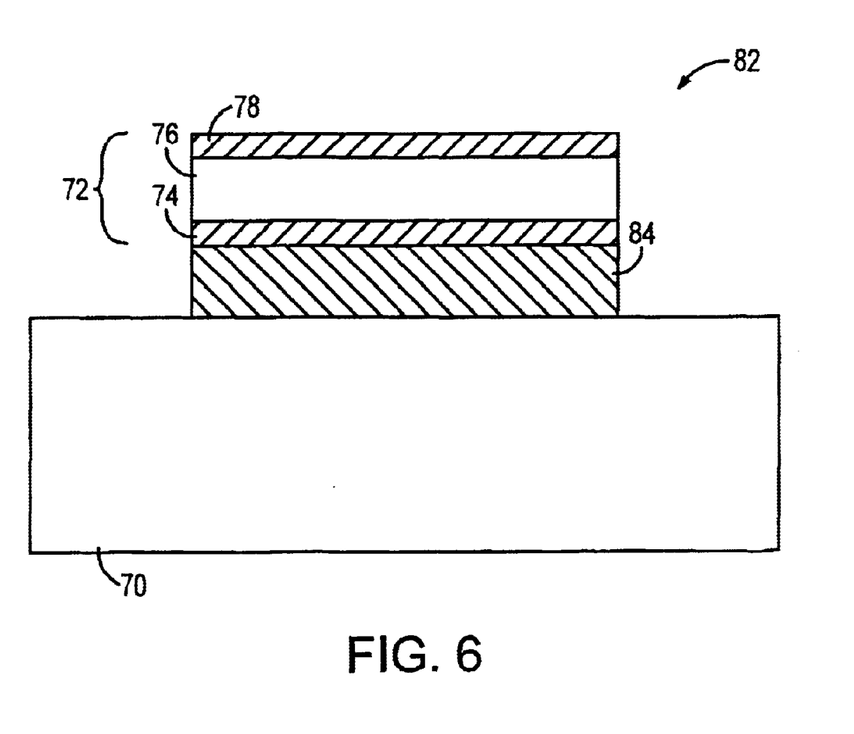
FIG. 6 is a solidly mounted resonator (SMR) with an acoustic Bragg reflector, with the top electrode of the SMR being oxidized according to the process of FIG. 5.

As one embodiment, FIG. 4 shows an electrode-piezoelectric stack 72 suspended over a cavity 80 to provide resonator-to-air interfaces at both sides. Alternatively, a solidly mounted resonator (SMR) 82 of FIG. 6 is fabricated without diverging from the invention. The SMR 82 is shown as including an acoustic Bragg reflector 84 that is situated below the electrode-piezoelectric stack 72 and above the substrate 70 to provide a large acoustic impedance. The Bragg reflector 84 is made of layers of alternating high and low acoustic impedance materials, with each layer having a thickness of approximately one quarter wavelength of the resonant frequency of the SMR 82.

Referring back to FIG. 5, an electrode-piezoelectric stack having an off-target resonant frequency is selected in step 90. Typically, the "selection" step is implemented by identifying an FBAR that does not meet a specification. In an exemplary case, it is assumed that the FBAR to be fabricated is unintentionally outside of the acceptable margin of error (e.g., 1%) of the target resonator frequency.

Figure 7:
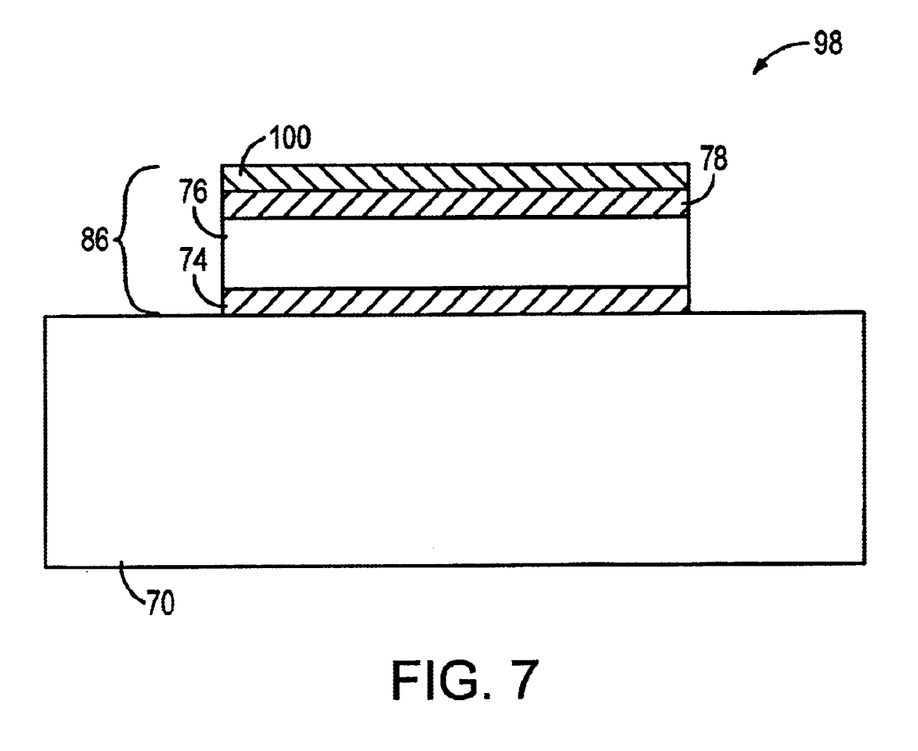
FIG. 7 is a cross-sectional view of an FBAR after oxidation.

In step 92 of FIG. 5, the FBAR having an off-target resonant frequency is corrected by thermal oxidation. When exposed to oxygen, the oxidation process alters the molecular structure of the Mo that is located on the surface of the top electrode layer, forming molybdenum oxide. Referring to FIG. 7, a molybdenum oxide layer 100 is formed on the surface of the top electrode layer 78 of an FBAR 98. While the layers 78 and 100 are shown as being separate layers, they are integrally linked. As a result of intentionally induced oxidation, the overall thickness of the top electrode layer (now comprising of the former electrode layer 78 and an additional molybdenum layer 100) increases. Since the resonant frequency for a given FBAR is dependent upon the "weighted thickness" of the electrode-piezoelectric stack 86, the resonant frequency can be modified by varying the total thickness of the electrode layers 78 and 74 relative to the piezoelectric layer 76. Accordingly, the resonant frequency exhibited by the FBAR 98 can be adjusted downwardly in a controlled manner.

According to another aspect of the invention, the thermal oxidation step 92 of FIG. 5 can be used to stabilize the resonant frequency of the FBAR 98. As the molybdenum oxide layer 100 continues to grow on the surface of the top electrode layer 78, the number of Mo available for further oxidation decreases in a logarithmic fashion. As a result, the thickness of the top electrode layer approaches a finite level over an extended period as the rate of oxidation decreases. Since the resonant frequency is dependent upon the "weighted thickness" of the piezoelectric stack 86, the resonant frequency for the FBAR 98 is stabilized as the overall thickness of the electrode layer (now comprising the electrode layer 78 and the molybdenum oxide layer 100) approaches a steady state relative to the piezoelectric layer 76.

Figure 8:
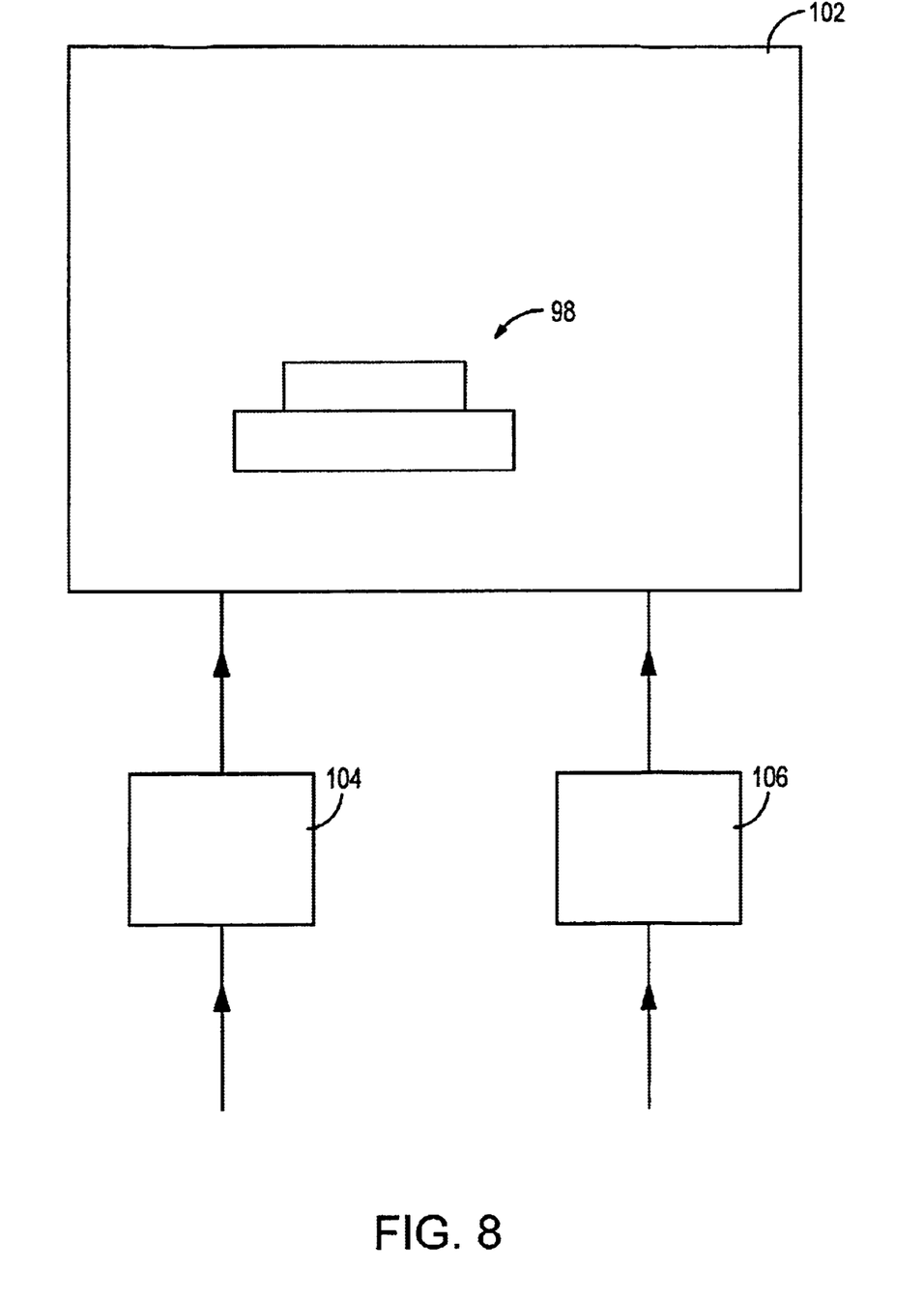
FIG. 8 is a rapid thermal annealer (RTA) that may be used in the process of FIG. 5.

In one embodiment, the thermal oxidation step 92 of FIG. 5 occurs in an oxidation-inducing environment that is air over a hot-plate. In an alternative embodiment, oxidation step 92 occurs in an oxidation-inducing environment that is within a rapid thermal annealer (RTA). Referring to FIG. 8, an RTA 102 is shown in which the temperature can be elevated by a temperature controller 104. Moreover, the flow rates and percentages of gases, including oxygen, entering the oxidizing environment of RTA 102 can be controlled by a gas monitor controller 106. In an exemplary embodiment, the temperature of the oxidization inducing environment is elevated to 215 degrees Celsius.

Figure 9:
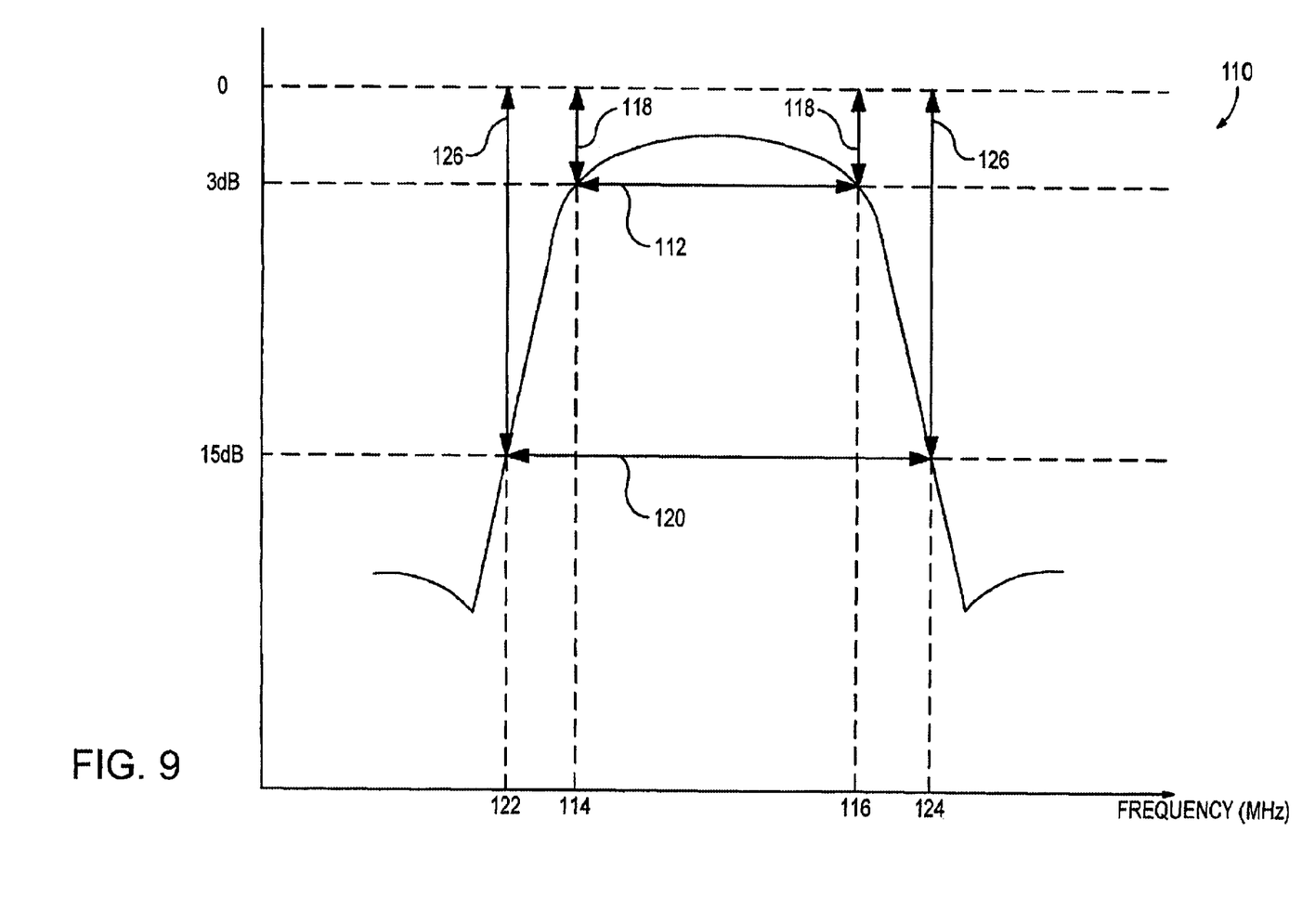
FIG. 9 is a graph explaining the characteristics of a band-pass filter of the type used in FIG. 7.

With reference to FIG. 9, a filter response 110 of the FBAR 98 is shown. The passband at the 3 dB bandwidth 112 corresponds to a left frequency 114 (i.e., $f_{3dB\_L}$) and a right frequency 116 (i.e., $f_{3dB\_R}$). The two frequencies 114 and 116 at which the transmission drops by 3 dB is the 3 dB insertion loss 118 of the 3 dB bandwidth 112. Similarly, the passband at the 15 dB bandwidth 120 corresponds to a left frequency 122 (i.e., $f_{15dB\_L}$) and a right frequency 124 (i.e., $f_{15dB\_R}$). The two frequencies 122 and 124 at which the transmission drops by 15 dB define the 15 dB insertion loss 126 of the 15 dB bandwidth 120.

Figure 10:
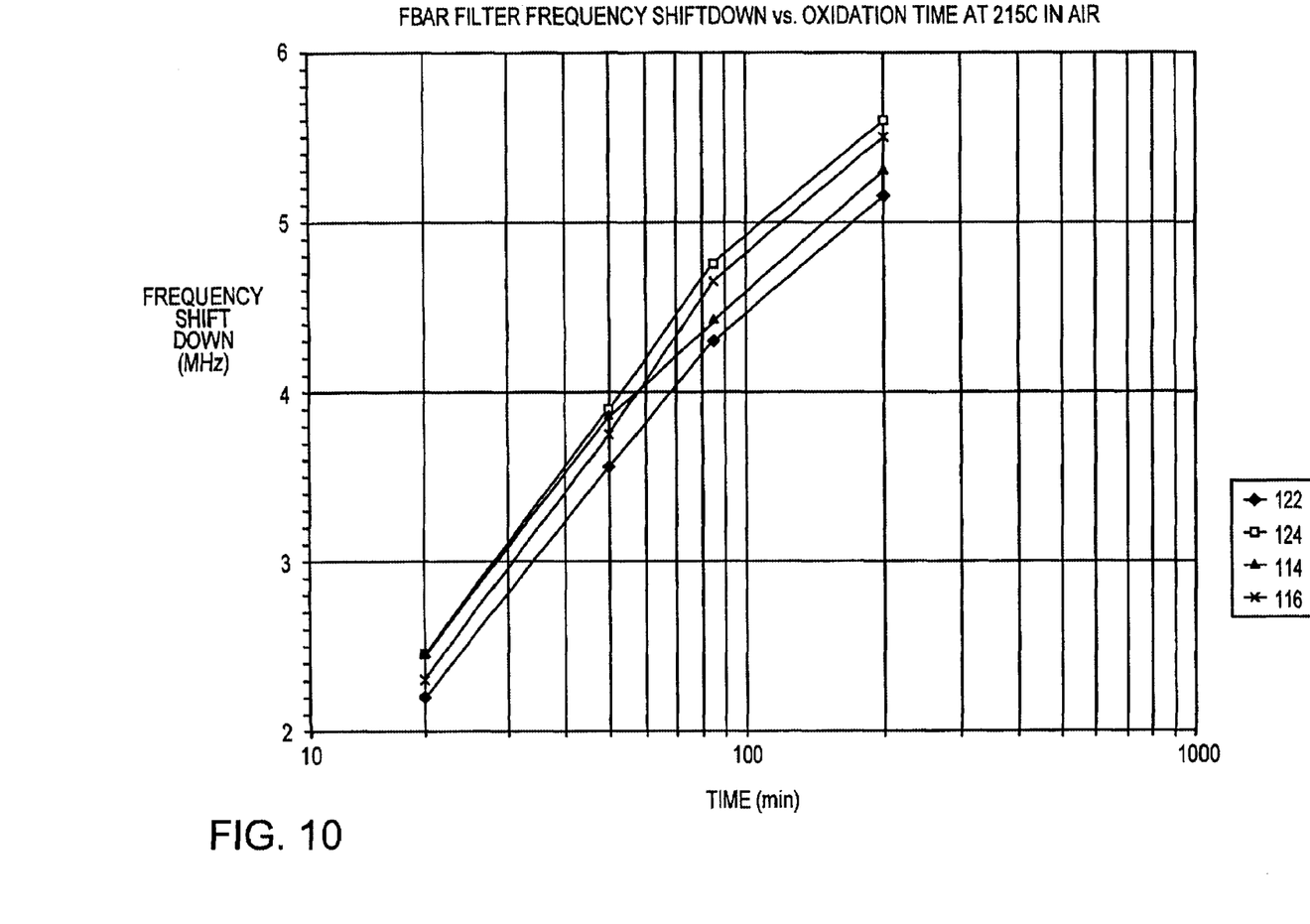
FIG. 10 is a graph showing the downward frequency shift of a band-pass filter of the type used in FIG. 7 at 215 degrees Celsius.

Referring to FIG. 10, a graph is shown in which the FBAR 98 is intentionally exposed to an oxidation environment at an elevated temperature of 215 degrees Celsius. The horizontal axis is the measure of time t in minutes and the vertical axis is the measure of frequency f shift down in MHz. Each of the plots (i.e., 122, 114, 116 and 124) in FIG. 10 represents one of the four passband frequencies 122, 114, 116 and 124 in FIG. 9. As the FBAR is intentionally oxidated for a selected period of time t, there is a change in frequencies 122, 114, 116 and 124 as a function of time. The left frequency 114 and the right frequency 116 corresponding to the 3 dB bandwidth 112 are adjusted downwardly. Similarly, the left frequency 122 and the right frequency 124 corresponding to the 15 dB bandwidth 120 are adjusted downwardly.

An empirical relationship between oxidation time t and the downward shift $y_f$ in frequency is given by:

$$y_f = 1.291 \ln t - 1.5673$$

where the frequency f is measured in MHz and the time t is measured in minutes. In an exemplary embodiment, a thermal oxidation time of 100 minutes at 215 degrees Celsius would result in a downward shift of frequencies 114, 116, 122 and 124 of approximately 4.4 MHz.

Moreover, FIG. 10 shows a strong linear correlation between an increase in time and a downward shift in frequencies 114, 116, 122 and 124. The coefficient of linear correlation r can be determined from the formula:

$$r = \frac{\sum (x - \bar{x})(y - \bar{y})}{(n-1)s_x s_y}$$

where x is time t measured in minutes, $\bar{x}$ is the sample mean of x, y is the downward frequency shift measured in MHz, $\bar{y}$ is the sample mean of y, and $s_x$ and $s_y$ are the standard deviations of the x and y variables. The coefficient r always has a value between −1 and +1, reflecting the consistency of the effect that a change in one variable has on the other. A value of +1 signifies a perfect positive correlation, and a value of −1 shows a perfect negative correlation. Interpolating the empirical data into the given formula, the coefficient of linear correlation r is approximately 0.996, which reflects a downward shift in frequency as being almost linear, given the increase in oxidation time at 215 degrees Celsius in air.

Figure 11:
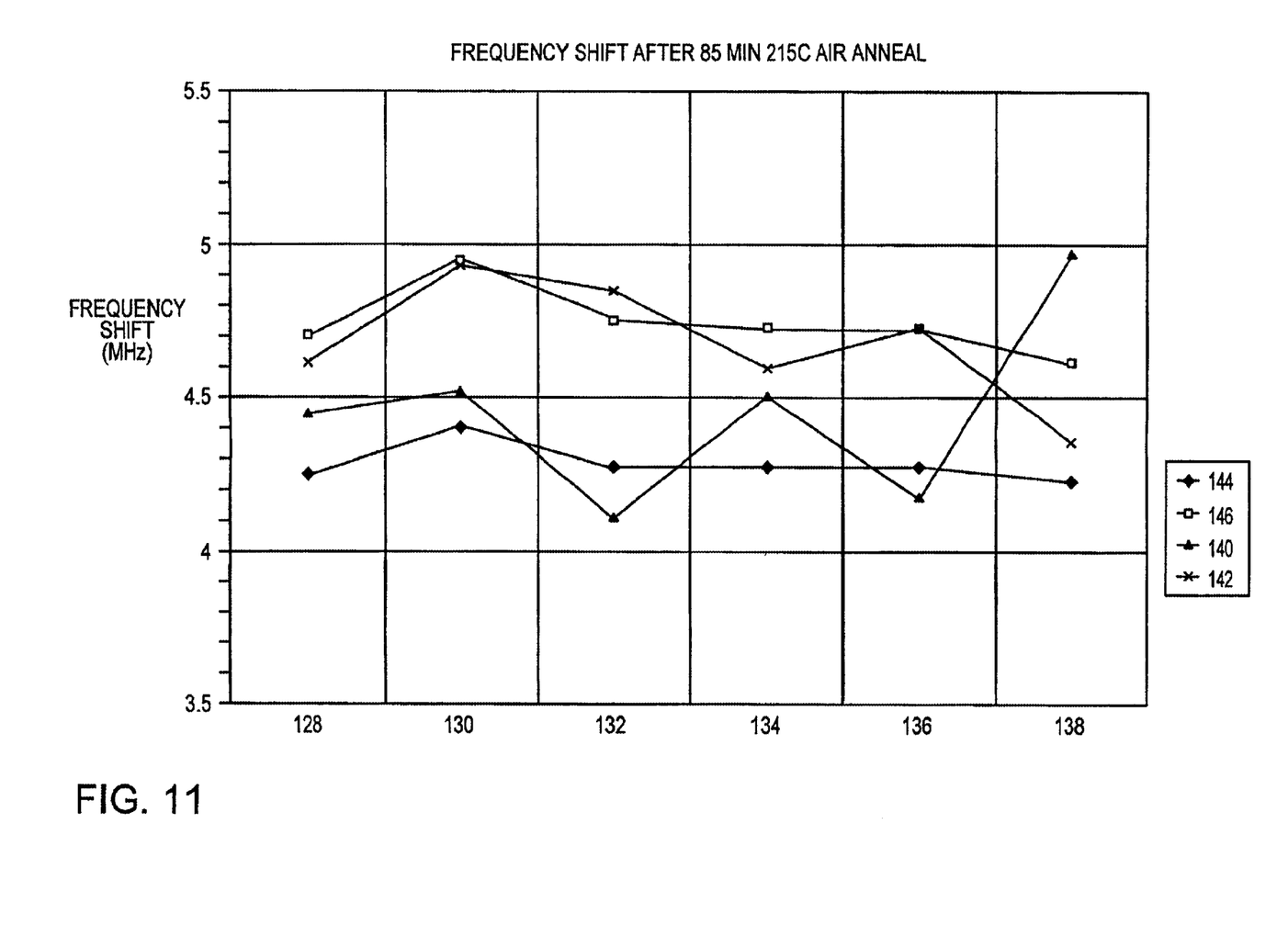
FIG. 11 is a graph showing the frequency shifts due to oxidation for six sample FBARs.

FIG. 11 illustrates the frequency shifts measured in MHz on the vertical axis due to oxidation after eight-five minutes at 215 degrees Celsius air anneal for six sample FBARs 128, 130, 132, 134, 136 and 138 that are designated on the horizontal axis. For the sample FBAR 128, the bandpass characteristics are given by (a) the left frequency 144 corresponding to the 15 dB insertion loss, (b) the left frequency 140 corresponding to the 3 dB insertion loss, (c) the right frequency 142 corresponding to the 3 dB insertion loss, and (d) the right frequency 146 corresponding to the 15 dB insertion loss. FIG. 11 follows the same format as FIG. 9. That is, the frequencies 144, 146, 140 and 142 of the sample FBAR 128 in FIG. 11 correspond to the respective frequencies 122, 114, 116 and 124 of the FBAR 110 in FIG. 9.

After eighty-five minutes at 215 degrees Celsius air anneal, there is a shift in frequencies 144, 146, 140 and 142 within the magnitude of approximately 1 MHz after shifting downwardly in the order of approximately 4.25 MHz to 4.7 MHz. The empirical data derived from the shift of the four frequencies 144, 146, 140 and 142 of the sample FBAR 128 of FIG. 11 suggests that the 3 dB bandpass and the 15 dB bandpass retained their characteristics throughout the oxidation process. That is, the sample filter 128 did not experience any significant change in resonant frequency.

While the invention has been described as being used in an FBAR 98 having a single piezoelectric layer 76, the invention may be extended to stacked FBARs, i.e., SBARs, without diverging from the level of skill in the art. That is, arrays of FBARs having stacked piezoelectric layers that are separated by electrode layers may be fabricated to have the target resonant frequencies, so as to achieve desired filter characteristics.

What is claimed is:

1. A method of achieving a resonant frequency of acoustic resonators comprising:
    fabricating a plurality of said acoustic resonators on a basis of forming each said acoustic resonator to include an electrode-piezoeletric stack in which layer dimensions are selected to achieve an intended operational resonant frequency, said intended operational resonant frequency being a target final operational resonant frequency, each said electrode-piezoelectric stack having conductive electrode layers;
    determining whether said acoustic resonators have current resonant frequencies that are within an acceptable margin of error of said intended operational resonant frequency; and
    for occasions in which said current resonant frequencies are outside of said acceptable margin of error, exposing said acoustic resonators to a controlled gaseous environment in which at least one said electrode layer is oxidized, including intentionally regulating said controlled gaseous environment on a basis of providing each said acoustic resonator with a final operational resonant frequency that is within said margin of error of said intended operational resonant frequency;
    wherein said exposing includes regulating said temperature and oxygen content to provide a downward adjustment of said resonant frequencies in a controlled manner, said exposing further including controlling flow rates of gases, including oxygen.

2. The method of claim 1 wherein said exposing includes controlling said temperature and controlling said oxygen content within said controlled gaseous environment based on establishing said final operational resonant frequencies within said margin of error of said intended operational resonant frequency.

3. The method of claim 1 wherein said exposing occurs at a temperature not exceeding 215° C.

4. A method of achieving a resonant frequency of acoustic resonators comprising:
    fabricating a plurality of said acoustic resonators on a basis of forming each said acoustic resonator to include an electrode-piezoelectric stack in which layer dimensions are selected to achieve an intended operational resonant frequency, said intended operational resonant frequency being a target final operational resonant frequency, each said electrode-piezoelectric stack having conductive electrode layers;
    determining whether said acoustic resonators have current resonant frequencies that are within an acceptable margin of error of said intended operational resonant frequency; and for occasions in which said current resonant frequencies are outside of said acceptable margin of error, exposing said acoustic resonators to a controlled gaseous environment in which at least one said electrode layer is oxidized, including intentionally regulating said controlled gaseous environment on a basis of providing each said acoustic resonator with a final operational resonant frequency that is within said margin of error of said intended operational resonant frequency;

wherein said exposing includes regulating said temperature and oxygen content to provide a downward adjustment of said resonant frequencies in a controlled manner, said exposing further including controlling flow rates of gases, including oxygen, said exposing occurring in a Rapid Thermal Annealer (RTA).

5. The method of claim 4 wherein said exposing includes controlling said temperature and controlling said oxygen content within said controlled gaseous environment based on establishing said final operational resonant frequencies within said margin of error of said intended operational resonant frequency.

* * * * *